United States Patent
Handy et al.

(10) Patent No.: US 10,320,378 B2
(45) Date of Patent: Jun. 11, 2019

(54) PASSIVE LEAKAGE MANAGEMENT CIRCUIT FOR A SWITCH LEAKAGE CURRENT

(71) Applicant: GE Aviation Systems Limited, Cheltenham, Gloucestershire (GB)

(72) Inventors: Peter James Handy, Cheltenham (GB); Nicholas George Tembe, Cheltenham (GB)

(73) Assignee: GE AVIATION SYSTEMS LIMITED, Gloucestershire (GB)

( * ) Notice: Subject to any disclaimer, the term of this patent is extended or adjusted under 35 U.S.C. 154(b) by 0 days.

(21) Appl. No.: 15/502,544

(22) PCT Filed: Aug. 7, 2015

(86) PCT No.: PCT/EP2015/068307
§ 371 (c)(1),
(2) Date: Feb. 8, 2017

(87) PCT Pub. No.: WO2016/023841
PCT Pub. Date: Feb. 18, 2016

(65) Prior Publication Data
US 2017/0230043 A1    Aug. 10, 2017

(30) Foreign Application Priority Data
Aug. 15, 2014  (GB) .................................. 1414561.9

(51) Int. Cl.
*H03K 17/16* (2006.01)
*H03K 19/00* (2006.01)

(52) U.S. Cl.
CPC ......... *H03K 17/16* (2013.01); *H03K 19/0016* (2013.01); *H03K 19/0013* (2013.01)

(58) Field of Classification Search
None
See application file for complete search history.

(56) References Cited

U.S. PATENT DOCUMENTS

| 7,538,454 B2 | 5/2009 | Yu et al. |
| 2009/0021874 A1 | 1/2009 | Divito et al. |
| 2013/0027150 A1* | 1/2013 | Mahooti ................. G05F 3/242 |
| | | 331/186 |

(Continued)

FOREIGN PATENT DOCUMENTS

| CN | 102545852 A | 7/2012 |
| GB | 2 178 255 A | 2/1987 |

(Continued)

OTHER PUBLICATIONS

Combined Search and Examination Report issued in connection with corresponding GB Application No. 1414561.9 dated Nov. 28, 2014.

(Continued)

*Primary Examiner* — Cassandra F Cox
(74) *Attorney, Agent, or Firm* — McGarry Bair PC

(57) ABSTRACT

A passive leakage management circuit for a switch leakage current includes a switch being operable in a first operating mode, wherein the switch output supplies an output current having a first predetermined voltage. In a second operating mode, the switch output supplies a leakage current having a second voltage, a first current path, and a leakage current path.

15 Claims, 2 Drawing Sheets

(56) References Cited

U.S. PATENT DOCUMENTS

2015/0326226 A1* 11/2015 Kumar ............... H03K 19/0027
327/333

FOREIGN PATENT DOCUMENTS

WO  2007/006021 A1  1/2007
WO  2014/013381 A1  1/2014

OTHER PUBLICATIONS

International Search Report and Written Opinion issued in connection with corresponding PCT Application No. PCT/EP2015/068307 dated Nov. 12, 2015.
Examination Report issued in connection with corresponding GB Application No. 1414561.9 dated Sep. 19, 2016.
International Preliminary Report on Patentability issued in connection with corresponding PCT Application No. PCT/EP2015/068307 dated Feb. 21, 2017.
Office Action issued in connection with corresponding CA Application No. 2957049 dated Nov. 16, 2017.

* cited by examiner

PASSIVE LEAKAGE MANAGEMENT CIRCUIT FOR A SWITCH LEAKAGE CURRENT

BACKGROUND

Electrical circuits may be configured having a switch for controlling an electrical operation, such as enabling or disabling an electrical load. For example, the switch may be controllable to toggle between in a first mode of operation, wherein the switch is "closed" and current is transmitted from a switch input to a switch output, and a second mode of operation, wherein the switch is "open" and current is prevented from transmitting between the switch input and switch output.

In some electrical devices, such as switches, current may leak between the switch input and switch output when the switch is open, due to the electrical characteristics or physical limitations of the switch. In some environments, it may be desirable to plan for and control the leakage current, which may include specific leakage current path for transmission of the leakage current.

BRIEF DESCRIPTION

One embodiment relates to a passive leakage management circuit for a switch leakage current includes a switch having a switch input, and a switch output electrically coupled with an electrical load, and operable in a first operating mode, wherein the switch output supplies an output current provided to the input and having a first predetermined voltage, and in a second operating mode, wherein the switch output supplies a leakage current from the input and having a second voltage lower than the first voltage, a first current path comprising at least a first transistor, wherein the first transistor conducts current along the first current path based on the switch output, and a leakage current path comprising at least a second transistor, wherein the second transistor conducts current along the leakage current path based on the first transistor conducting current. At least one of the first current path or leakage current path conducts current automatically based on the switch output, independent of the state of the switch.

DETAILED DESCRIPTION

As used herein, a switch is an electrical device that may be controllable to toggle and/or between in a first mode of operation, wherein the switch is "closed" and current is transmitted from a switch input to a switch output, and a second mode of operation, wherein the switch is "open" and current is prevented from transmitting between the switch input and switch output. The embodiments may be implemented in any electrical circuit environment having a switch, wherein a leakage current exists when the switch is in the open state. A non-limiting example of an electrical circuit environment may include an aircraft power system architecture, which enables production of electrical power from at least one spool of a turbine engine, such as a gas turbine engine, and delivers the electrical power to a plurality of electrical loads via at least one solid state switch, such as a solid state power controller (SSPC) switching device.

Additionally, while terms such as "voltage", "current", and "power" may be used herein, it will be evident to one skilled in the art that these terms may be interchangeable when describing aspects of the electrical circuit, or circuit operations.

Figure 1:
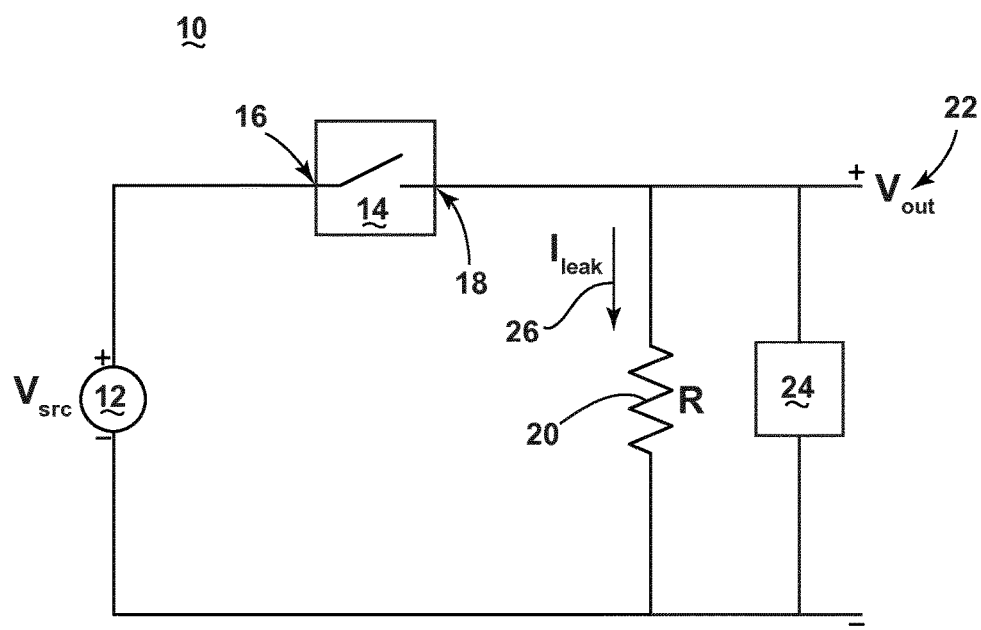
FIG. 1 is a prior art diagram of an electrical circuit having a leakage current path.

FIG. 1 illustrates a prior art diagram of a leakage management circuit 10. The leakage management circuit 10 includes a voltage source 12 in series with a switching component 14 (hereafter, "switch") having a switch input 16 coupled with the voltage source 12 and a switch output 18 further coupled with a leakage resistor 20. The leakage resistor 20 may be configured in parallel with a voltage output 22, which may, for example, be electrically coupled with one or more electrical loads, shown as a single load 24. In this example, the switch 14 controls the "on" and "off" operation of the circuit 10 and/or the load 24, but will supply a leakage current when the switch 14 is open.

The circuit 10 is configured such that when the switch 14 is closed, current travels from the voltage source 12, through the switch 14, to the electrical load 24. While the switch 14 is closed, a portion of the current may also travel across the leakage resistor 20, however the leakage resistor 20 is selected such that a substantial amount of the power in the circuit 10 is supplied to the electrical load 24. The circuit 10 is also configured such that when the switch 14 is open as shown, a substantial amount of a leakage current 26 supplied by the switch 14, and thus a large amount of the leakage power, will be dissipated across the resistor 20. In this sense, even though the electrical circuit 10 is "off," a small amount of leakage current 26 is supplied and must be accounted for in the circuit 10.

However, this configuration will also conduct a large amount of current through the resistor 20, and thus, dissipate a large amount of power, when the switch 14 is closed. To account for this otherwise wasted power dissipation, alternative prior art embodiments are known to include a second switch, controllable to enable or disable the leakage current 26 path, to correspond, respectively, with the switch 14 being open or closed. However, these prior art embodiments require an "awareness" or "knowledge" of the state of the switch 14, that is, if the switch is opened or closed. In this sense, such embodiments are actively controlled, based on the state of the switch 14.

Figure 2:
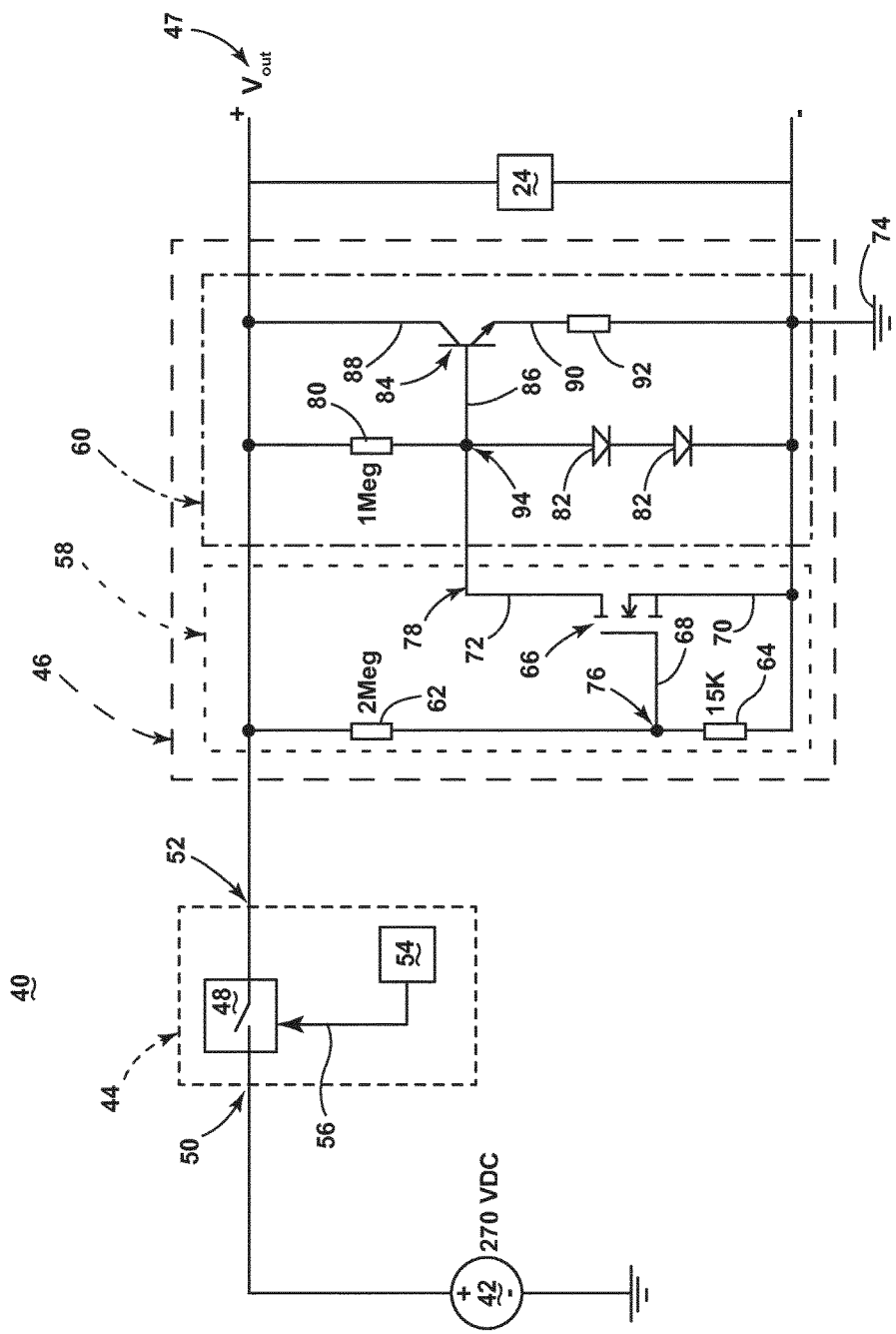
FIG. 2 is a diagram of a passive leakage management circuit in accordance with an embodiment.

FIG. 2 illustrates a passive leakage management circuit 40 according to embodiments. The leakage management circuit 40 comprises a voltage source, for example, a 270 Volt direct current (DC) voltage source 42 in series with a solid state switch, shown as an SSPC 44, and a non-linear voltage-controlled current sink (VCCS) 46. The VCCS 46 may be configured in parallel with a voltage output 47, which may, for example, be electrically coupled with one or more electrical loads, shown as a single load 24.

The SSPC 44 may further comprise a switching component 48 electrically coupled with the voltage source 42 via an SSPC input 50, and the VCCS 46 via an SSPC output 52. The switching component 48 is operable in a first operating mode, wherein the switching component 48 is closed and the SSPC output 52 supplies an output current provided by the voltage source 42 to the SSPC input 50 ("closed state"), and in a second operating mode, wherein the switching component 48 is open, yet the SSPC output 52 supplies a leakage current from the SSPC input 50 ("open state"). The SSPC 44 may further include a controller 54 configured to provide a control signal 56 to the switching component 48 to operate the switch in the open and closed states.

The switching component 48 in the closed state is configured to supply a predetermined voltage from the voltage source 42, such as 270 VDC, to the VCCS 46, whereas the switching component 48 in the open state will supply a leakage current having a leakage voltage, which is lower or less than the predetermined voltage. One non-limiting example of a leakage voltage may include 25 VDC. One non-limiting example of the SSPC 44 may include a silicon carbide (SiC) or Gallium Nitride (GaN) based, high power switch. SiC or GaN may be selected based on their solid state material construction, their ability to handle high voltages and large power levels in smaller and lighter form factors, and their high speed switching ability to perform electrical operations very quickly. Additional switching devices and additional silicon-based power switches may be included.

The VCCS 46 further comprises a voltage control circuit portion 58 and a current sink circuit portion 60, configured in parallel with each other and the electrical load 24. The voltage control circuit portion 58 may comprise a first resistor 62, shown as a 2 megaohm resistor, a second resistor 64, shown as a 15 kiloohm resistor, and a first transistor, such as a metal-oxide-semiconductor field-effect transistor (MOSFET) 66 having a gate terminal 68, a source terminal 70, and a drain terminal 72. The first and second resistors 62, 64 are configured in series, running between the voltage output 47 and a common ground 74, with a first node 76 located between the resistors 62, 64 and electrically coupled with the gate terminal 68 of the MOSFET 66. The drain terminal 72 of the MOSFET 66 if further electrically coupled with a voltage control circuit output 78, and the source terminal 70 of the MOSFET 66 is electrically coupled with the common ground 74.

The current sink circuit portion 60 of the VCCS 46 comprises a third resistor 80, shown as a 1 megaohm resistor, at least one diode, shown as identical dual diodes 82, a second transistor, such as a bipolar transistor 84 having a base terminal 86, collector terminal 88, and emitter terminal 90, and a leakage resistor 92, shown as a 680 ohm resistor. The third resistor 80 is configured in series with each diode 82, running between the voltage output 47 and the common ground 74, with the diodes 82 forward facing toward the common ground 74. A second node 94 is located between the third resistor 80 and diodes 82, and electrically coupled with both the base terminal 86 of the bipolar transistor 84 and the voltage control circuit output 78. The collector terminal 88 of the bipolar transistor 84 is further coupled with the voltage output 47 and the emitter terminal 90 of the bipolar transistor 84 is further coupled with the common ground 74, via the leakage resistor 92. While a leakage resistor 92 is described, the leakage resistor 92 may further comprise, for example, one or more a shunt resistors, variable resistors, or zener diodes. Additional leakage resistors 92 may be included.

The first and second resistors 62, 64 of the voltage control circuit portion 58 are selected to provide the first node 76 a voltage and current sufficient to operate the gate terminal 68 of the MOSFET 66 during different SSPC outputs 52. Additionally and/or alternatively, the MOSFET 66 may be selected to operate in a particular configuration, such as selecting a MOSFET 66 with a specific gate threshold voltage, to allow the source terminal 70 and drain terminal 72 to conduct current. Embodiments may include configurations of the first resistor 62, second resistor 64, and/or MOSFET 66 such that when the SSPC output 52 provides a current having the predetermined voltage indicating the switching component 48 is closed, the first node 76 will provide a voltage sufficient to enable, or "turn on" the MOSFET 66, such that the MOSFET 66 will conduct current between the source terminal 70 and the drain terminal 72, effectively providing a "low" voltage signal (e.g. zero volts) to the voltage control circuit output 78.

Additionally, the embodiments may include configurations of the first resistor 62, second resistor 64, and/or MOSFET 66 such that when the SSPC output 52 provides a leakage current having the leakage voltage indicating the switching component 48 is open, the first node 76 will provide a voltage insufficient to turn on the MOSFET 66 (i.e. the MOSFET 66 "turns off"), such that the MOSFET 66 will not conduct current between the source terminal 70 and the drain terminal 72, effectively providing a "high" voltage signal (e.g. greater than 1.2 V) to the voltage control circuit output 78.

The current sink circuit portion 60 of the VCCS 46 operates such that the bipolar transistor 84 is disabled, or "turns off" such that the transistor 84 does not conduct current between the collector terminal 88 and the emitter terminal 90, in response to a "low" voltage signal on the base terminal 86, which, is electrically coupled with the voltage control circuit output 78. Conversely, the current sink circuit portion 60 of the VCCS 46 operates such that the bipolar transistor 84 is enabled, or "turns on" such that the transistor 84 conducts current between the collector terminal 88 and the emitter terminal 90, in response to a "high" voltage signal on the base terminal 86. The third resistor 80 and/or bipolar transistor 84 may be selected, in combination with the diodes 82 and/or the MOSFET 66, to provide a sufficient on/off operation based on the threshold voltage of the bipolar transistor 84 and/or the expected voltages at the second node.

Thus, the leakage management circuit 40 operates in two distinct modes. In a first closed mode, having a closed switching component 48 such that the SSPC output 52 supplies the output current provided to the SSPC input 50, having a predetermined voltage, such as 270 VDC to power and/or operate the electrical load 24. During this closed mode, the selection and/or configuration of the voltage control circuit portion 58, first resistor 62, second resistor 64, and/or MOSFET 66 turns on the MOSFET 66, such that it provides a "low" voltage signal, via the voltage control circuit output 78, to the third terminal 94 of the current sink circuit portion 60. The current sink circuit portion 60 of the VCCS 46, in response to the "low" voltage signal from the voltage control circuit output 78, turns off the bipolar transistor 84. This operation, in turn, defines a first current path originating from the SSPC output 52 and traversing, at least, through the third resistor 80, the second node 94, and between the source terminal 70 and drain terminal 72 of the MOSFET 66, to the common ground 74.

The leakage management circuit 40 further operates in a second leakage mode, having an open switching component 48 such that the SSPC output supplies a leakage current having a maximum leakage voltage, such as 25 VDC, where the leakage voltage is determined by ohm's law by multiplying leakage current through switch 48 by the resistance of leakage resistor 92. While 25 VDC is given as a non-limiting example, it is understood that the selection of the leakage resistor 92 is not a parameter of the leakage itself, but is determined by the resistor 92 selected to affect a controlled leakage current amount. During this leakage mode, the selection and/or configuration of the voltage control circuit portion 58, first resistor 62, second resistor 64, and/or MOSFET 66 turns off the MOSFET 66, such that it provides a "high" voltage signal, via the voltage control circuit output 78, to the third terminal 94 of the current sink circuit portion 60. The current sink circuit portion 60 of the VCCS 46, in response to the "high" voltage signal from the voltage control circuit output 78, turns on the bipolar transistor 84. This operation, in turn, defines a leakage current path originating from the SSPC output 52 and traversing, at least, between the collector terminal 88 and emitter terminal 90 of the bipolar transistor 84, through the leakage resistor 92, to the common ground 74. Embodiments may enable only one of the first current path or leakage current path at any given moment.

In this sense, the leakage management circuit 40 conducts current along the first current path based on the SSPC output 52, and the circuit 40 conducts current along the leakage current path based on the MOSFET 66 conducting current. The leakage management circuit 40 is, thus, passive, or unmanaged, and will operate based on the SSPC output 52 alone, independent and/or without awareness of the state of the switching component 48.

Consequently, the third resistor 80 may be selected to provide a low power dissipation along the first current path when the SSPC output 52 is powering the electrical load 24, and the leakage resistor 92 may be selected to provide a different low power dissipation along the leakage current path when the SSPC output 52 provides the leakage current. The leakage resistor 92 may further be selected to provide a given leakage voltage for a given leakage current amount, while the switching component 48 is open. With the example resistors 62, 64, 80, 92 and components shown, the combined current through the first and second current paths may be approximately 0.4 mA when the switching component 48 is closed, while the current through the leakage current path may be approximately 0.6 mA when then switching component 48 is open. This equates to leakage management circuit 40 power dissipations of approximately 109 mW and 23 mW, respectively, and therefore compared with a basic single leakage resistor 20, less power is wasted when switching component 48 is closed than when the switching component 48 is open. This example assumes the leakage resistor 92 is 680 ohms, and the forward voltage of the two diodes and the base-emitter voltage of the bipolar transistor 84 are each 0.6 V.

Many other possible embodiments and configurations in addition to that shown in the above figures are contemplated by the present disclosure. For example, while a MOSFET 66 is shown as the first transistor and a bipolar transistor 84 is shown as the second transistor, it will be evident to one skilled in the art that these devices may be interchangeable with alternative transistor types and/or configurations to provide controlled operation in response to selected circuit operates. Furthermore, while examples, for instance, the MOSFET 66 and/or bipolar transistor 84 generating "low" or "high" voltage signals, and correspondingly, "on" or "off" operations, it will be evident to one skilled in the art that alternative transistor and/or circuit configurations may invert the high/low or on/off operations, yet provide for substantially similar leakage management circuit 40 operations. Additionally, embodiments may include transistors that may not necessarily operate in strict "on" or "off" modes of operation, and may operate according to one or more non-linear modes of operation. In these embodiments, the non-linear modes of operation may generate transitional electrical characteristics on the circuit 40 until they settle into a steady-state mode of operation, which may be considered the "on" or "off" mode of operation, as described above.

In even yet another embodiment, the leakage current may be caused by components other than just the switching component 48. For example, input and/or output voltage monitors, in or about the SSPC 44 may contribute to an overall leakage current. Additional source of leakage current may be included. In yet another embodiment, leakage current dissipation may be further improved by providing a second, or more, redundant leakage current circuits 40 to avoid possible component failures in the VCCS 46. Additionally, the design and placement of the various components may be rearranged such that a number of different in-line configurations could be realized.

The embodiments disclosed herein provide a leakage management circuit for a leaky switch by enabling a leakage current path independent to, or without awareness of, the state of the switch. The above-described embodiments provide for a leakage current path for dissipating leakage power, thereby reducing the likelihood that hazardous voltages or unmanaged current will have unintended consequences on the electrical circuit, including creating shorts, voltage spikes, thermal consequences such as fire, or shocking hazards. Furthermore, by including redundant leakage management circuits, the likelihood of unintended consequences if further reduced in the scenario of component failure. Reducing the likelihood of unintended consequences increases the overall safety of the electrical system.

Another aspect that may be realized in the above-described embodiments is that the enabling of the different current paths provides for a leakage management circuit that avoids unnecessary power dissipation by providing a first current path for low power dissipation while the switch is closed, and a leakage current path for low power dissipation while the switch is opened. Low power dissipation result in less wasted power in the electrical circuit.

Yet another aspect that may be realized in the above-described embodiments is that the leakage management circuit operates effectively without needing awareness or knowledge of the state of the switch in order to maintain the leakage management functionality. This eliminates the need for monitoring the state of the switch for leakage management, and may further eliminate the need for any additional controllers, second switches, and additional power and/or circuit requirements associated with state-based leakage management circuits. Reduced components result in improved reliability of the overall leakage management circuit.

To the extent not already described, the different features and structures of the various embodiments may be used in combination with each other as desired. That one feature may not be illustrated in all of the embodiments is not meant to be construed that it may not be, but is done for brevity of description. Thus, the various features of the different embodiments may be mixed and matched as desired to form new embodiments, whether or not the new embodiments are expressly described. All combinations or permutations of features described herein are covered by this disclosure.

This written description uses examples to disclose the embodiments, including the best mode, and also to enable any person skilled in the art to practice the embodiments, including making and using any devices or systems and performing any incorporated methods. The patentable scope of the application is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A passive leakage management circuit for a switch leakage current comprising:
    a switch having a switch input, and a switch output electrically coupled with an electrical load, and operable in a first and a second operating mode, wherein in the first operating mode the switch output supplies an output current provided to the input and having a first predetermined voltage, and in the second operating mode the switch output supplies a leakage current from the input and having a second voltage lower than the first voltage;
    a first current path comprising at least a first transistor, wherein the first transistor conducts current along the first current path based on the switch output; and
    a leakage current path comprising at least a second transistor, wherein the second transistor conducts current along the leakage current path based on the first transistor conducting current;
    wherein at least one of the first current path or leakage current path conducts current automatically based on the switch output, without an additional power source beyond the switch output, and independent of the state of the switch.

2. The passive leakage management circuit of claim 1, wherein the leakage current path further comprises a first resistor configured to dissipate a first amount of power when the leakage current path conducts current.

3. The passive leakage management circuit of claim 2, wherein the first current path further comprises a second resistor configured to dissipate a second amount of power when the first current path conducts current.

4. The passive leakage management circuit of claim 3, wherein the first amount of power is less than the second amount of power.

5. The passive leakage management circuit of claim 2, wherein the first resistor further comprises a resistor configured to dissipate the leakage current.

6. The passive leakage management circuit of claim 5, wherein the first resistor comprises at least one of a shunt resistor, a variable resistor, or a zener diode.

7. The passive leakage management circuit of claim 1, wherein the switch comprises a solid state power controller (SSPC).

8. The passive leakage management circuit of claim 1, wherein the first predetermined voltage is 270 VDC.

9. The passive leakage management circuit of claim 1, wherein the second voltage is 25 VDC.

10. The passive leakage management circuit of claim 1, wherein the first transistor comprises a metal-oxide-semiconductor field-effect transistor (MOSFET).

11. The passive leakage management circuit of claim 10, wherein the MOSFET comprises a gate terminal, a source terminal, and a drain terminal, and wherein the MOSFET is configured to conduct current between the source terminal and drain terminal when the gate terminal is exposed to a voltage greater than the MOSFET threshold voltage.

12. The passive leakage management circuit of claim 1, wherein the second transistor comprises a bipolar transistor.

13. The passive leakage management circuit of claim 1, wherein at least one of the first current path or the leakage current path conducts current automatically based on the switch output, without awareness of the state of the switch.

14. The passive leakage management circuit of claim 3, wherein the first resistor further comprises a resistor configured to dissipate the leakage current.

15. The passive leakage management circuit of claim 4, wherein the first resistor further comprises a resister configured to dissipate the leakage current.

* * * * *